US012740193B2

(12) United States Patent
Liao

(10) Patent No.: US 12,740,193 B2
(45) Date of Patent: Sep. 15, 2026

(54) LIGHT EMITTING DIODE EPITAXIAL STRUCTURE BASED ON ALUMINUM GALLIUM NITRIDE MATERIAL AND ITS MANUFACTURING METHOD

(71) Applicant: XUZHOU LIYU ADVANCED TECHNOLOGY CO., LTD., Xuzhou (CN)

(72) Inventor: Yitao Liao, Xuzhou (CN)

(73) Assignee: XUZHOU LIYU ADVANCED TECHNOLOGY CO., LTD., Xuzhou (CN)

( * ) Notice: Subject to any disclaimer, the term of this patent is extended or adjusted under 35 U.S.C. 154(b) by 374 days.

(21) Appl. No.: 18/688,515

(22) PCT Filed: Mar. 28, 2023

(86) PCT No.: PCT/CN2023/084342
§ 371 (c)(1),
(2) Date: Mar. 1, 2024

(87) PCT Pub. No.: WO2023/202331
PCT Pub. Date: Oct. 26, 2023

(65) Prior Publication Data

US 2025/0015231 A1 Jan. 9, 2025

(30) Foreign Application Priority Data

Apr. 19, 2022 (CN) ........................ 202210409685.X

(51) Int. Cl.
*H10H 20/825* (2025.01)
*H10H 20/01* (2025.01)
(Continued)

(52) U.S. Cl.
CPC .... *H10H 20/825* (2025.01); *H10H 20/01335* (2025.01); *H10H 20/815* (2025.01); *H10H 20/819* (2025.01)

(58) Field of Classification Search
CPC ........... H10H 20/825; H10H 20/01335; H10H 20/815; H10H 20/819; H10H 20/0137
See application file for complete search history.

(56) References Cited

U.S. PATENT DOCUMENTS 5,740,192 A * 4/1998 Hatano ............... H01S 5/32341 257/101
5,998,810 A * 12/1999 Hatano ............... H01S 5/32341 257/101
(Continued)

FOREIGN PATENT DOCUMENTS

CN 101258616 B * 6/2011 ........... H10H 20/815
CN 103489975 A * 1/2014 ........... H10H 20/816
(Continued)

*Primary Examiner* — Laura M Menz
(74) *Attorney, Agent, or Firm* — Schwabe, Williamson & Wyatt, P.C.

(57) ABSTRACT

A light emitting diode epitaxial structure (LEDES) based on an aluminum gallium nitride material and a manufacturing method thereof are described. The LEDES includes a first layer of n-type aluminum gallium nitride, an active layer comprising aluminum gallium nitride, a p-type aluminum gallium nitride, and a second layer of n-type aluminum gallium nitride disposed above the p-type aluminum gallium nitride along an epitaxial growth direction. An epitaxial layer comprising a gallium nitride layer is contained between an epitaxial layer of the p-type aluminum gallium nitride and an epitaxial layer of the second layer of n-type aluminum gallium nitride. The epitaxial layer comprising the gallium nitride layer has an energy band width smaller than those of the epitaxial layers of the p-type aluminum gallium nitride and the second layer of n-type aluminum
(Continued)

gallium nitride. A coarsened structure exists on a surface of the second layer of n-type aluminum gallium nitride.

17 Claims, 2 Drawing Sheets

(51) Int. Cl.
*H10H 20/815* (2025.01)
*H10H 20/819* (2025.01)

(56) References Cited

U.S. PATENT DOCUMENTS

2014/0103289 A1* 4/2014 Liao .................... H10H 20/825
438/46
2021/0249554 A1 8/2021 Lu et al.
2025/0015231 A1* 1/2025 Yitao Liao .......... H10H 20/819

FOREIGN PATENT DOCUMENTS

| | | | | | |
|---|---|---|---|---|---|
| CN | 104157761 | A | * | 11/2014 | H10H 20/825 |
| CN | 102859723 | B | * | 9/2015 | H10H 20/8215 |
| CN | 103489975 | B | * | 9/2016 | H10H 20/816 |
| CN | 104157761 | B | * | 2/2017 | H10H 20/825 |
| CN | 106898948 | A | * | 6/2017 | H01S 5/34333 |
| CN | 107293629 | A | * | 10/2017 | H10W 90/00 |
| CN | 108493311 | A | * | 9/2018 | H10H 20/8582 |
| CN | 106684213 | B | * | 1/2019 | H01S 5/34333 |
| CN | 109301044 | A | * | 2/2019 | H10H 20/815 |
| CN | 107195738 | B | * | 7/2019 | H10H 20/8252 |
| CN | 110447113 | A | * | 11/2019 | H10H 20/825 |
| CN | 111312877 | A | * | 6/2020 | H10H 20/825 |
| CN | 114497307 | A | * | 5/2022 | H10H 20/825 |
| CN | 110447113 | B | * | 8/2022 | H10H 20/825 |
| CN | 114497307 | B | * | 8/2022 | H10H 20/825 |
| CN | 116779634 | A | * | 9/2023 | |
| CN | 118398737 | A | * | 7/2024 | H10H 20/841 |
| CN | 118398737 | B | * | 9/2024 | H10H 20/841 |
| CN | 119029109 | B | * | 9/2025 | |
| CN | 121218747 | A | * | 12/2025 | |
| EP | 2615650 | A2 | * | 7/2013 | B65D 90/511 |
| EP | 2615650 | B1 | * | 12/2014 | H01B 5/14 |
| JP | H08255932 | A | * | 10/1996 | |
| JP | H10173232 | A | * | 6/1998 | |
| JP | 2012031047 | A | * | 2/2012 | H10P 14/3416 |
| JP | 2013165261 | A | * | 8/2013 | B65D 90/511 |
| JP | 5514920 | B2 | * | 6/2014 | H01B 5/14 |
| JP | 6500239 | B2 | * | 4/2019 | H10H 20/825 |
| KR | 20130083859 | A | * | 7/2013 | H01B 5/14 |
| KR | 101398340 | B1 | * | 5/2014 | H01B 5/14 |
| WO | WO-2010027016 | A1 | * | 3/2010 | H10H 20/812 |
| WO | WO-2018175751 | A1 | * | 9/2018 | H10H 20/825 |

* cited by examiner

LIGHT EMITTING DIODE EPITAXIAL STRUCTURE BASED ON ALUMINUM GALLIUM NITRIDE MATERIAL AND ITS MANUFACTURING METHOD

RELATED APPLICATIONS

This application is a continuation of International App. No. PCT/CN2023/084342 filed on Mar. 28, 2023, which is based upon and claims priority to Chinese App. No. 202210409685.X filed on Apr. 19, 2022, entitled "A Light Emitting Diode Epitaxial Structure Based on Aluminum Gallium Nitride Material and Its Manufacturing Method", the contents of each of which are hereby incorporated by reference in their entireties and for all purposes.

TECHNICAL FIELD

The present disclosure relates to the technical field of semiconductors, in particular to a light emitting diode epitaxial structure based on aluminum gallium nitride material and methods for manufacturing the same.

BACKGROUND

Visible spectrum light emitting diodes (LEDs) based on indium gallium nitride and aluminum indium gallium phosphorus material system have matured and are currently in mass production. However, the development of ultraviolet (UV) LEDs is still hindered by many difficulties, including the basic material properties of aluminum gallium nitride alloys, especially alloys with high aluminum content. For example, compared to LEDs with external quantum efficiency (EQE) greater than 50% in the visible spectral range, deep UV LEDs emitting less than 300 nanometers (nm) only have up to 1% EQE. EQE is the ratio of extracted photons to injected electron-hole pairs. It is expected that UV LEDs with emission wavelengths ranging from 230 nm to 350 nm will have widespread applications, most of which are based on the interaction between UV radiation and biomaterials. Typical applications include surface disinfection, water purification, medical equipment and biochemistry, ultrahigh density optical recording light source, white light illumination, fluorescence analysis, sensing and zero emission vehicles. Despite years of in-depth research, UV LEDs, especially those emitting less than 300 nm, are still inefficient compared to blue or green devices.

One reason for the low efficiency of UV LEDs is the absorption of UV light by p-type gallium nitride (GaN) materials. Due to the difficulty in providing sufficient hole concentration and conductivity of p-type aluminum gallium nitride (AlGaN) with high aluminum content, UV LEDs continue to use the pn structure of p-type GaN. Therefore, finding new p-type layer structure that meets the requirement of UV transmittance and high conductivity may break through the efficiency limitations of UV LEDs.

SUMMARY

The present disclosure describes a light emitting diode epitaxial structure (LEDES) based on aluminum gallium nitride (AlGaN) material and methods for manufacturing the same. The LEDES is capable of extracting UV light absorbed in traditional UV LEDs from a p-side.

Examples of the presently described embodiments discussed herein include the following, non-limiting examples. Each of the following non-limiting examples may stand on its own or may be combined in any permutation or combination with any one or more of the other examples provided infra and/or elsewhere throughout the present disclosure.

Example 1 includes a LEDES based on an AlGaN material comprising a structure disposed on a substrate, a buffer layer of aluminum nitride, a first layer of n-type AlGaN, an active layer comprising AlGaN, a p-type AlGaN layer, and a second layer of n-type AlGaN disposed above the p-type AlGaN layer along an epitaxial growth direction.

Example 2 includes the LEDES of example 1, wherein a center emission wavelength of the active layer comprising AlGaN ranges between 255 nm and 340 nm.

Example 3 includes the LEDES of examples 1 to 2, wherein an epitaxial layer comprising a gallium nitride (GaN) layer is contained between an epitaxial layer of the p-type AlGaN layer and an epitaxial layer of the second layer of n-type AlGaN.

Example 4 includes the LEDES of example 3, wherein the epitaxial layer comprising the GaN layer has an energy bandwidth smaller than those of the epitaxial layers of the p-type AlGaN layer and the second layer of n-type AlGaN.

Example 5 includes the LEDES of examples 1 to 4, wherein a coarsened structure exists on a surface of the second layer of n-type AlGaN.

Example 6 includes the LEDES of examples 1 to 4, wherein a coarsened structure is formed on a surface of the second layer of n-type AlGaN.

Example 7 includes the LEDES of examples 1 to 6, wherein the second layer of n-type AlGaN has a thickness of 100 nm.

Example 8 includes the LEDES of examples 1 to 6, wherein the second layer of n-type AlGaN has a thickness ranging from 100 nm to 200 nm.

Example 9 includes the LEDES of examples 1 to 6, wherein the second layer of n-type AlGaN has a thickness ranging from 100 nm to 300 nm.

Example 10 includes the LEDES of examples 1 to 6, wherein the second layer of n-type AlGaN has a thickness ranging from 200 nm to 500 nm.

Example 11 includes the LEDES of examples 1 to 10, wherein the second layer of n-type AlGaN has a thickness between 0.8 and 3 times of the center emission wavelength of the UV LED.

Example 12 includes a method for manufacturing a LEDES based on an AlGaN material, wherein the coarsened structure is formed through wet etching and photolithography mask processes, so that a pyramid shaped microstructure is formed on a surface of the second layer of n-type AlGaN.

Example 13 includes a method for manufacturing a LEDES based on an AlGaN material, wherein the coarsened structure is achieved through dry etching and photolithography mask processes, so that an discontinuity in an x-y plane (e.g., a two-dimensional plane perpendicular to an epitaxial growth direction) occurs on a surface of the second layer of AlGaN, and wherein the discontinuity can disrupt the transmission of UV light within the epitaxial layer (e.g., disrupting the waveguide transmission or total reflection of light in the plane) and promote an output of light.

Example 14 includes a method for manufacturing a LEDES based on an AlGaN material, wherein the coarsened structure is achieved through electron beam lithography process or nanoimprinting process, so that a discontinuity in an x-y plane (e.g., a two-dimensional plane perpendicular to an epitaxial growth direction) occurs on a surface of the second layer of n-type AlGaN, wherein the discontinuity can disrupt the transmission of UV light within the epitaxial layer (e.g., disrupting the waveguide transmission or total reflection of light in the plane) and promote an output of light, and wherein a three-dimensional (3D) geometric structure similar to a photonic crystal and a nanowire is formed on the surface of the second layer of n-type AlGaN.

Example 15 includes a method for manufacturing a LEDES based on an AlGaN material, the method comprising: forming a buffer layer of aluminum nitride disposed on a substrate; forming a first layer of n-type AlGaN disposed on the buffer layer; forming an active layer disposed on the first layer, wherein the active layer comprises AlGaN; forming a p-type AlGaN layer disposed on the active layer; forming a second layer of n-type AlGaN disposed on the p-type AlGaN layer along an epitaxial growth direction; and forming a coarsened structure disposed on the second layer.

Example 16 includes the method of example 15, wherein the method comprises: forming an epitaxial layer comprising a gallium nitride (GaN) layer between an epitaxial layer of the p-type AlGaN layer and an epitaxial layer of the second layer of n-type AlGaN.

Example 17 includes the method of example 16, wherein the epitaxial layer comprising the GaN layer has an energy bandwidth smaller than an energy bandwidth of the epitaxial layer of the p-type AlGaN layer.

Example 18 includes the LEDES of examples 16 to 17, wherein the epitaxial layer comprising the GaN layer has an energy bandwidth smaller than an energy bandwidth of the epitaxial layer of the second layer of n-type AlGaN.

Example 19 includes the method of examples 16 to 18, wherein the coarsened structure is formed through wet etching and photolithography mask processes such that a pyramid shaped microstructure is formed on a surface of the second layer of n-type AlGaN.

Example 20 includes the method of examples 16 to 18, wherein the coarsened structure is formed through dry etching and photolithography mask processes.

Example 21 includes the method of examples 16 to 18, wherein the coarsened structure is formed through an electron beam lithography process.

Example 22 includes the method of examples 16 to 18, wherein the coarsened structure is formed through a nanoimprinting process.

Example 23 includes the method of examples 20 to 22, wherein the coarsened structure is formed such that a discontinuity in an x-y plane occurs on a surface of the second layer of n-type AlGaN.

Example 24 includes the method of example 23, wherein the discontinuity is capable of disrupting transmission of UV light within the epitaxial layer and promote an output of light.

Example 25 includes the method of examples 15 to 24, wherein the method comprises: forming a 3D geometric structure similar to a photonic crystal and a nanowire on the surface of the second layer of n-type AlGaN.

On the basis of the various examples and schemes discussed previously, further adopting light extraction structure schemes as shown in FIGS. 1-4 can achieve the effect of increasing the output of UV light on the p-side, which includes, but not limited to:

1. the effect of increasing the overall quantum efficiency of an UV LED, the contribution of main increment of which comes from the increase in light extraction efficiency;
2. reducing the optical waveguide transmission effect of UV light in the AlGaN epitaxial layer;
3. reducing the heating effect of an UV LED;
4. increasing the optical power output value of an UV LED; and
5. increasing the external quantum efficiency (EQE) of an UV LED.

BRIEF DESCRIPTION OF DRAWINGS

Example embodiments are illustrated by way of example, and not limitation, in the figures of the accompanying sheets of drawings in which.

Figure 1:
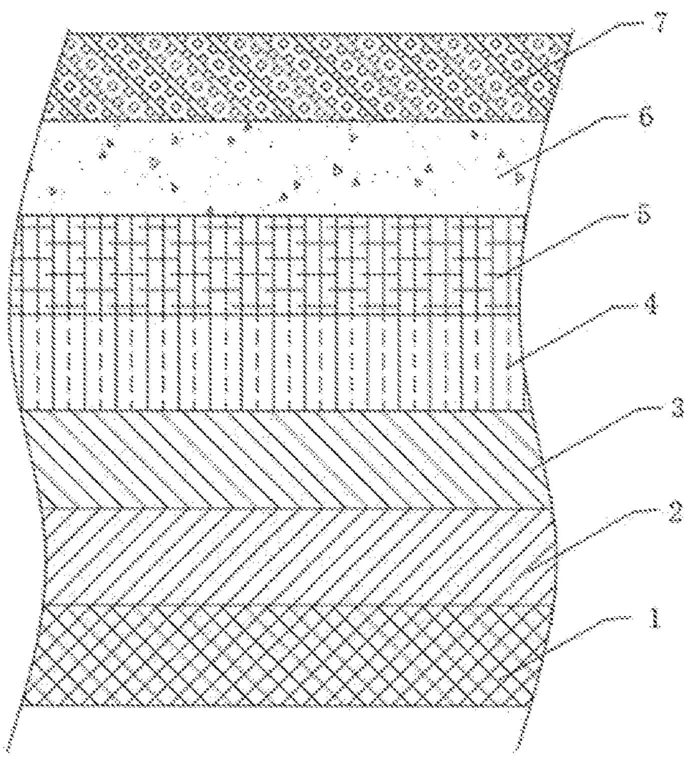
FIG. 1 shows an unprocessed epitaxial layer structure of the present disclosure.

The labels in FIGS. 1-4 are as follows: 1. substrate; 2. aluminum nitride buffer layer; 3. a first layer of n-type aluminum gallium nitride; 4. an active layer comprising aluminum gallium nitride; 5. p-type aluminum gallium nitride layer; 6. a gallium nitride layer; 7. a second layer of n-type aluminum gallium nitride.

DETAILED DESCRIPTION

In order to facilitate the understanding of those skilled in the art, the embodiments of the present disclosure are explained in conjunction with the accompanying drawings. The same reference numbers may be used in different drawings to identify the same or similar elements. In the following description, for purposes of explanation and not limitation, specific details are set forth such as particular structures, configurations, arrangements, architectures, techniques, explanation, specific numbers, materials, and the like, in order to provide a thorough understanding of various aspects of the example embodiments. However, it will be apparent to those skilled in the art having the benefit of the present disclosure that the various aspects of the example embodiments may be practiced using different aspects or elements that depart from the specific details described herein. In certain instances, descriptions of well-known devices, circuits, and methods are omitted so as not to obscure the description of the example embodiments with unnecessary detail. Further, various operations may be described as multiple discrete operations, in turn, in a manner that should be helpful in understanding the example embodiments. However, the order of such operations should not be construed as to imply that these operations are necessarily order dependent, and some or all of the described operations may be omitted, rearranged, and/or divided into multiple additional operations.

As used herein, the singular forms “a,” “an” and “the” are intended to include plural forms as well, unless the context clearly indicates otherwise. It will be further understood that the terms “comprises” and/or “comprising,” when used in this specification, specific the presence of stated features, integers, steps, operations, elements, and/or components, but do not preclude the presence or addition of one or more other features, integers, steps, operation, elements, components, and/or groups thereof. The phrase "A and/or B" means (A), (B), or (A and B). For the purposes of the present disclosure, the phrase "A, B, and/or C" means (A), (B), (C), (A and B), (A and C), (B and C), or (A, B and C). The phrase "X(s)" means one or more X or a set of X. The description may use the phrases "in an embodiment," "In some embodiments," "in one implementation," "In some implementations," "in some examples", and the like, each of which may refer to one or more of the same or different embodiments, implementations, and/or examples. Furthermore, the terms "comprising," "including," "having," and the like, as used with respect to the present disclosure, are synonymous.

The present disclosure describes various aspects of a light emitting diode epitaxial structure (LEDES) based on an aluminum gallium nitride (AlGaN) material. The LEDES embodiments described herein optimize the light extraction structure of a UV LED based on tunneling effect. A UV LED using an n-p-n type tunneling structure avoids very effectively, in the p-n structure of an UV diode, the absorption of UV light by traditional p-type gallium nitride (GaN), that is, a carrier injection structure based on tunneling effect using n-type AlGaN (whose aluminum (Al) component is high enough to make its energy bandwidth basically (effectively) transparent to UV light from the active layer) and a very thin layer of n-type or undoped GaN (e.g., 5 nm and below), and a layer of p-type AlGaN (whose Al component is high enough to make its energy bandwidth basically (effectively) transparent to UV light from the active layer). The UV LED with this structure may need to be combined with a new light extraction structure and technology to effectively extract the UV light absorbed in the traditional UV LED from the p-side.

FIGS. 1 to 4 show examples of LEDES based on an AlGaN material. The LEDES can form a part of a semiconductor structure that is used for photoelectric or electronic components or devices, such as emitters, lasers, diodes, phototubes, solar cells, transistors, storage devices, microprocessors, and/or the like. The semiconductor structure includes at least one layer containing an AlGaN material. In some embodiments, the AlGaN material/layer is grown or formed on a substrate (e.g., substrate 1), a buffer layer (e.g., buffer layer 2), another Group III-V material layer, and/or another material. Additionally or alternatively, the AlGaN material is made using a three-dimensional (3D) growth mode. In these examples, the growth surface of this layer is atomically smooth, and the root mean square (RMS) roughness measured by atomic force microscopy (AFM) is less than approximately 1 nanometer (nm).

In some embodiments, a quantum well layer is grown by a method selected from a group comprising molecular-beam epitaxy (MBE), metal organic chemical vapor deposition (MOCVD) (also known as metalorganic vapor-phase epitaxy (MOVPE)), and atomic layer deposition (ALD). In some examples, the quantum well layer includes regions with different Mole fraction of aluminum nitride (AlN), and the regions are distributed perpendicular to the growth direction as a result of the growth process. Additionally or alternatively, the oxygen impurity concentration in the quantum well layer is less than $1\times10^{18}$ atoms per $cm^3$. In some embodiments, the growth process generates a quantum well layer with a smooth surface. Here, the smooth surface basically has no surface structure, and the smooth surface has an RMS surface roughness of less than about 1 nm as measured by an AFM method. In some embodiments, the generation of a superlattice structure associated with the quantum well layer is not included. Therein, the oxygen impurity concentration in the barrier layer of the superlattice structure is less than $1\times10^{18}$ atoms per $cm^3$.

In some embodiments, a buffer layer (e.g., buffer layer 2) of AlN, gallium nitride (GaN), AlGaN, or AlGaN containing indium (In) is directly grown or formed on the surface of the substrate (e.g., substrate 1). As examples, the substrate is formed from or otherwise includes one or more materials selected from a group comprising sapphire, silicon wafers (e.g., silicon dioxide (SiO2)), AlN, GaN, AlGaN, and silicon carbide (SiC). In some implementations, the buffer layer has a thickness ranging from about 1 micrometer (μm) to about 5 μm. Additionally or alternatively, the buffer layer includes a polycrystalline or non-monocrystalline structure. In one example, the substrate 1 is sapphire, and before the growth of the buffer layer 2, the surface of the sapphire substrate 1 on which the buffer layer 2 is to be grown is nitridated by exposure to ammonia or plasma activated nitrogen.

In some embodiments, an n-type AlGaN layer (e.g., first layer 3) is grown or formed on the buffer layer. In these embodiments, the AlGaN material of the n-type AlGaN layer is described by the molecular formula: $Al_{(x)}Ga_{(1-x)}N$, wherein $0\leq x\leq 1$. Additionally or alternatively, the n-type AlGaN layer has a thickness ranging from about 100 nm to about 10 μm. Additionally or alternatively, the n-type AlGaN layer is doped with silicon (Si), germanium (Ge), and/or some combination thereof. In one example, the doped element is Si, and the concentration of Si ranges from about $1\times10^{16}$ $cm^{-3}$ to about $1\times10^{21}$ $cm^{-3}$. In some implementations, a manufactured LED has an electroluminescent emission peak ranging from about 200 nm to about 365 nm.

Referring to FIGS. 1 to 4, a LEDES based on AlGaN material includes a first layer of n-type AlGaN 3, an active layer comprising AlGaN 4, a p-type AlGaN layer 5, and a second layer of n-type AlGaN structure disposed above the p-type AlGaN along an epitaxial growth direction, that are disposed on a substrate 1 and an AlN buffer layer 2. In some embodiments, the center emission wavelength of the active layer comprising AlGaN 4 ranges from 255 nm to 340 nm.

An epitaxial layer mainly composed of GaN layer 6 is between the p-type AlGaN 5 epitaxial layer and the second layer of n-type AlGaN 7 epitaxial layer. In some embodiments, the epitaxial layer 6 has an energy bandwidth smaller than those of the p-type AlGaN 5 and the second layer of n-type AlGaN 7 epitaxial layer mentioned previously. Additionally, there is a coarsened structure on the surface of the second layer of n-type AlGaN 7.

Another aspect of the present disclosure is a semiconductor structure (e.g., the LEDES) made by a manufacturing method. Preparation process: A deep UV LED structure based on an AlGaN material system is used, with an emission wave band ranging from 255 nm to 340 nm.

The manufacturing method includes a first operation where a substrate 1 is formed. The substrate 1 used includes, but is not limited to, sapphire, silicon wafer, AlN, GaN, AlGaN, SiC, and/or the like. The first operation of the manufacturing method can also include forming a buffer layer 2 on the substrate 1.

The manufacturing method includes a second operation where an n-type layer 3 is formed on the buffer layer 2. The n-type layer 3 used includes, but is not limited to, an AlGaN epitaxial layer doped with silicon element, which contains an aluminum component of more than 10%.

The manufacturing method includes a third operation where an active layer 4 is formed on the n-type layer 3. The active layer 4 used includes, but is not limited to, a structure of a quantum well, a quantum dot, a quantum disk, and/or the like, comprising a epitaxial layer of GaN, AlGaN, AlN, and/or the like, and/or any combination thereof.

The manufacturing method includes a fourth operation where above the active layer 4 (e.g., along an epitaxial growth direction of the wafer), an electron barrier layer based on AlGaN is formed or grown.

The manufacturing method includes a fifth operation where above the electron barrier layer (e.g., along the epitaxial growth direction of the wafer), a p-type carrier injection structure based on tunneling effect is grown or formed.

The manufacturing method includes a sixth operation where above the p-type carrier injection structure based on tunneling effect (e.g. along the epitaxial growth direction of the wafer), an n-type AlGaN structure is grown. In some examples, this n-type AlGaN structure is grown or formed with a thickness of no less than 100 nm.

On the basis of the aforementioned scheme (manufacturing method), an optimized design and process development for optical extraction is performed on the n-type AlGaN structure in the sixth operation so that its structure can extract the UV light emitted from the active layer 4 to the p-side to the maximum extent, which includes but is not limited to the following schemes.

Figure 2:
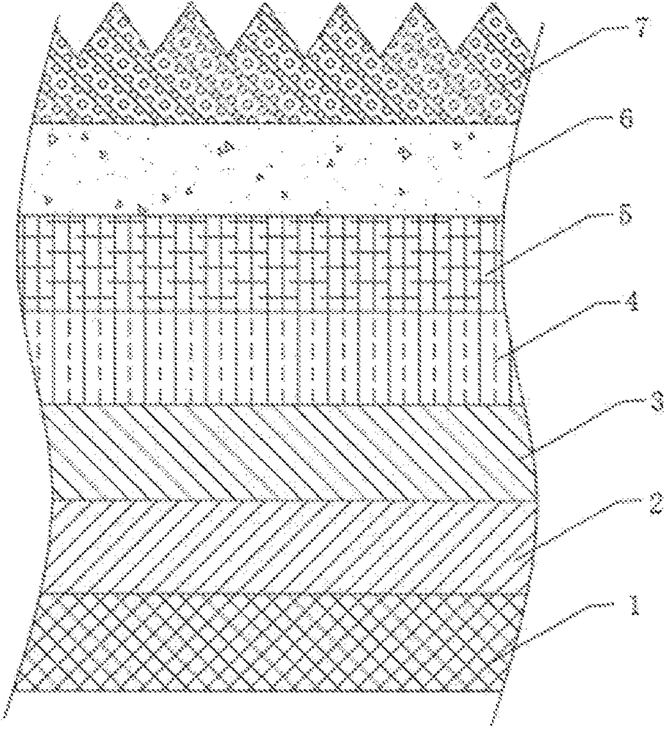
FIG. 2 shows an epitaxial layer structure processed by a wet chemical etching process.

FIG. 2 shows an example LEDES based on an AlGaN material produced by a first scheme (scheme 1). In scheme 1, a coarsened structure is formed through wet etching and photolithography mask processes, resulting in a pyramid shaped microstructure being formed on the surface of the second layer of n-type AlGaN 7.

Figure 3:
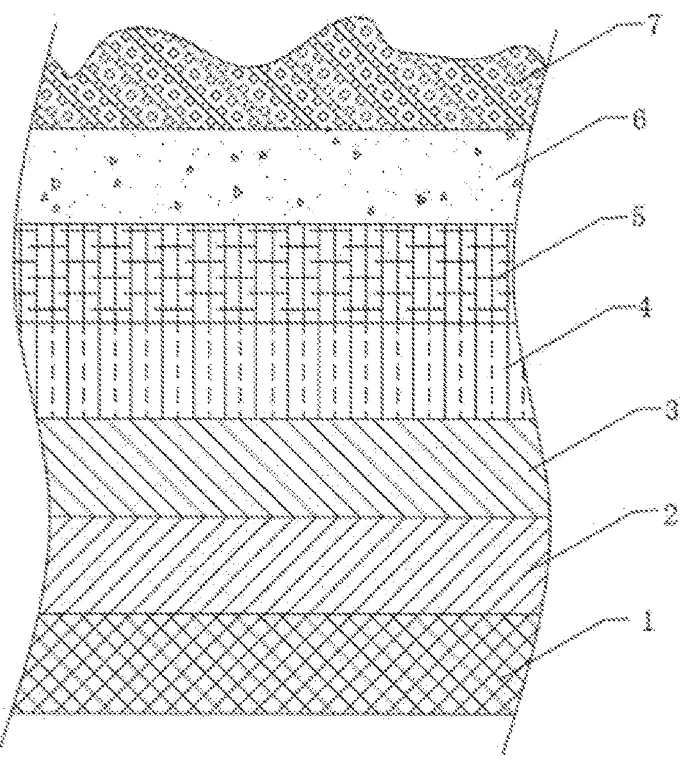
FIG. 3 shows an epitaxial layer structure processed by a dry chemical etching process.

FIG. 3 shows an example LEDES based on an AlGaN material produced by a second scheme (scheme 2). In scheme 2, a coarsened structure is achieved through dry etching and photolithography mask processes, resulting in discontinuities in the x-y plane (e.g., a two-dimensional (2D) plane perpendicular to the epitaxial growth direction) being formed on the surface of the second layer of AlGaN 7. Here, this type of discontinuity can disrupt the transmission of UV light within the epitaxial layer (e.g., disrupting the waveguide transmission or total reflection of light in the plane) and promote the output of light.

Figure 4:
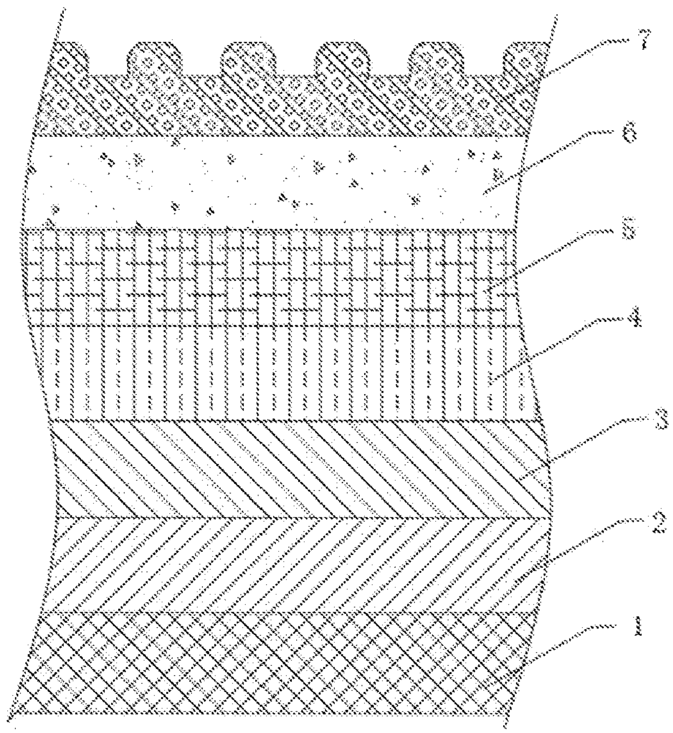
FIG. 4 shows an epitaxial layer structure processed by an electron beam lithography or nanoimprinting process.

FIG. 4 shows an example LEDES based on an AlGaN material produced by a third scheme (scheme 3). In scheme 3, a coarsened structure is achieved through an electron beam lithography process or a nanoimprinting process, resulting in discontinuities in the x-y plane (e.g., a 2D plane perpendicular to the epitaxial growth direction) being formed on the surface of the second layer of n-type AlGaN 7. Here, this type of discontinuity can disrupt the transmission of UV light within the epitaxial layer (e.g., disrupting the waveguide transmission or total reflection of light in the plane) and promote the output of light. A 3D geometric structure similar to a photonic crystal and/or a nanowire is formed on the surface of the second layer of n-type AlGaN 7.

The LEDES produced by at least one of the three aforementioned schemes can achieve the effect of increasing the output of UV light on the p-side, which can achieve the effects including, but not limited to:

1. the effect of increasing the overall quantum efficiency of a UV LED, the contribution of main increment of which comes from the increase in light extraction efficiency;
2. reducing the optical waveguide transmission effect of UV light in the AlGaN epitaxial layer;
3. reducing the heating effect of a UV LED;
4. increasing the optical power output value of a UV LED; and
5. increasing the external quantum efficiency (EQE) of an UV LED.

The embodiments of the present disclosure have been described merely for convenience and without limiting the scope of the present disclosure to any single inventive concept. Although specific aspects have been described herein, a person of ordinary skill in the art should appreciate that adaptations or variations can be made without departing from the scope of the present disclosure. Accordingly, the present disclosure is intended to cover any and all equivalents, modifications, adaptations, variations, and/or combinations of the disclosed embodiments.

What is claimed is:

1. A light emitting diode epitaxial structure (LEDES), comprising:

a buffer layer of aluminum nitride disposed on a substrate;

a first layer of n-type aluminum gallium nitride (AlGaN);

an active layer comprising AlGaN, wherein a center emission wavelength of the active layer ranges between 255 nanometers and 340 nanometers;

a p-type AlGaN layer;

a second layer of n-type AlGaN disposed above the p-type AlGaN along an epitaxial growth direction, wherein a coarsened structure exists on a surface of the second layer of n-type AlGaN, and the second layer of n-type AlGaN has a thickness between 0.8 and 3 times of the center emission wavelength of the active layer; and an epitaxial layer comprising a gallium nitride (GaN) layer is contained between an epitaxial layer of the p-type AlGaN and an epitaxial layer of the second layer of n-type AlGaN, and the epitaxial layer comprising the GaN layer has an energy band width smaller than those of the epitaxial layers of the p-type AlGaN and the second layer of n-type AlGaN.

2. The LEDES of claim 1, wherein the second layer of n-type AlGaN has a thickness of 100 nanometers.

3. The LEDES of claim 1, wherein the second layer of n-type AlGaN has a thickness ranging from 100 nanometers to 200 nanometers.

4. The LEDES of claim 1, wherein the second layer of n-type AlGaN has a thickness ranging from 100 nanometers to 300 nanometers.

5. The LEDES of claim 1, wherein the second layer of n-type AlGaN has a thickness ranging from 200 nanometers to 500 nanometers.

6. A method for manufacturing a light emitting diode epitaxial structure based on an aluminum gallium nitride (AlGaN) material, the method comprising:

forming a buffer layer of aluminum nitride disposed on a substrate;

forming a first layer of n-type AlGaN disposed on the buffer layer;

forming an active layer disposed on the first layer, wherein the active layer comprises AlGaN;

forming a p-type AlGaN layer disposed on the active layer;

forming a second layer of n-type AlGaN disposed on the p-type AlGaN layer along an epitaxial growth direction; and forming a coarsened structure disposed on the second layer.

7. The method of claim 6, wherein the coarsened structure is formed through wet etching and photolithography mask processes such that a pyramid shaped microstructure is formed on a surface of the second layer of n-type AlGaN.

8. The method of claim 6, wherein the method comprises: forming an epitaxial layer comprising a gallium nitride (GaN) layer between an epitaxial layer of the p-type AlGaN layer and an epitaxial layer of the second layer of n-type AlGaN.

9. The method of claim 8, wherein the epitaxial layer comprising the GaN layer has an energy bandwidth smaller than an energy bandwidth of the epitaxial layer of the p-type AlGaN layer.

10. The method of claim 8, wherein the epitaxial layer comprising the GaN layer has an energy bandwidth smaller than an energy bandwidth of the epitaxial layer of the second layer of n-type AlGaN.

11. The method of claim 8, wherein the coarsened structure is formed through dry etching and photolithography mask processes such that a discontinuity in an x-y plane occurs on a surface of the second layer of n-type AlGaN, and wherein the discontinuity can disrupt the transmission of ultraviolet light within the epitaxial layer and promote an output of light.

12. The method of claim 8, wherein the coarsened structure is formed through an electron beam lithography process or a nanoimprinting process such that a discontinuity in an x-y plane occurs on a surface of the second layer of n-type AlGaN, wherein the discontinuity can disrupt the transmission of ultraviolet light within the epitaxial layer and promote an output of light, and wherein a three-dimensional geometric structure similar to a photonic crystal and a nanowire is formed on the surface of the second layer of n-type AlGaN.

13. An apparatus comprising:

a light emitting diode epitaxial structure comprising:

a substrate;

a buffer layer of aluminum nitride disposed on the substrate;

a first layer of n-type aluminum gallium nitride (AlGaN);

an active layer comprising AlGaN, wherein a center emission wavelength of the active layer comprising AlGaN ranges between 255 nanometers and 340 nanometers;

a p-type AlGaN;

a second layer of n-type AlGaN disposed above the p-type AlGaN along an epitaxial growth direction, wherein a coarsened structure is on a surface of the second layer of n-type AlGaN, wherein the second layer of n-type AlGaN has a thickness between 0.8 and 3 times of the center emission wavelength of the active layer comprising AlGaN; and an epitaxial layer comprising a gallium nitride (GaN) layer contained between an epitaxial layer of the p-type AlGaN and an epitaxial layer of the second layer of n-type AlGaN, and the epitaxial layer comprising the GaN layer has an energy band width smaller than an energy bandwidth of the epitaxial layer of the p-type AlGaN and an energy bandwidth of the epitaxial layer of the second layer of n-type AlGaN.

14. The apparatus of claim 13, wherein the second layer of n-type AlGaN has a thickness of 100 nanometers.

15. The apparatus of claim 13, wherein the second layer of n-type AlGaN has a thickness ranging from 100 nanometers to 200 nanometers.

16. The apparatus of claim 13, wherein the second layer of n-type AlGaN has a thickness ranging from 100 nanometers to 300 nanometers.

17. The apparatus of claim 13, wherein the second layer of n-type AlGaN has a thickness ranging from 200 nanometers to 500 nanometers.

* * * * *